United States Patent [19]

Buehler et al.

[11] Patent Number: 5,396,169
[45] Date of Patent: * Mar. 7, 1995

[54] METHOD FOR CHARACTERIZING THE UPSET RESPONSE OF CMOS CIRCUITS USING ALPHA-PARTICLE SENSITIVE TEST CIRCUITS

[75] Inventors: Martin G. Buehler, LaCanada; Brent R. Blaes, San Dimas; Robert H. Nixon, Shadow Hills; George A. Soli, Lancaster, all of Calif.

[73] Assignee: Lynx Golf Inc., City of Industry, Calif.

[*] Notice: The portion of the term of this patent subsequent to Jul. 19, 2011 has been disclaimed.

[21] Appl. No.: 956,252

[22] Filed: Oct. 5, 1992

Related U.S. Application Data

[63] Continuation-in-part of Ser. No. 672,705, Mar. 19, 1991, Pat. No. 5,331,164.

[51] Int. Cl.$^6$ ............................................. G01R 1/04
[52] U.S. Cl. ................................... 324/158.1; 365/154; 437/26
[58] Field of Search .................. 324/158 R, 158 P; 365/154; 437/26

[56] References Cited

U.S. PATENT DOCUMENTS

4,529,884 7/1985 Wolicki et al. .................... 250/370

OTHER PUBLICATIONS

Zoutendyk et al., "Empirical Modelling of Single-Event Upset (SEU) in NMOS Depletion-Mode-Load Static RAM (SRAM) Chips." IEEE Transactions on Nuclear Science, vol. NS-33, No. 6, pp. 1581-1585, Dec. 1986.

*Primary Examiner*—Kenneth A. Wieder
*Assistant Examiner*—Barry C. Bowser
*Attorney, Agent, or Firm*—Leonard Tachner

[57] ABSTRACT

A method for predicting the SEU susceptibility of a standard-cell D-latch using an alpha-particle sensitive SRAM, SPICE critical charge simulation results, and alpha-particle interaction physics. A technique utilizing test structures to quickly and inexpensively characterize the SEU sensitivity of standard cell latches intended for use in a space environment. This bench-level approach utilizes alpha particles to induce upsets in a low LET sensitive 4-k bit test SRAM. This SRAM consists of cells that employ an offset voltage to adjust their upset sensitivity and an enlarged sensitive drain junction to enhance the cell's upset rate.

3 Claims, 12 Drawing Sheets

|  | | 1.0 MeV | 0.55 MeV |
|---|---|---|---|
| $x_0$ | Proton source | | |
| | Au Scattering Foil | $\delta X_1 = 1.20$<br>$E_1 = 1.00 \pm 0.012$ | $\delta X_1 = 1.20$<br>$E_1 = 0.55 \pm 0.012$ |
| $x_1$ | Vacuum | $\delta X_2 = 0$<br>$E_2 = 1.00 \pm 0.012$ | $\delta X_2 = 0$<br>$E_2 = 0.55 \pm 0.012$ |
| $x_2$ | Si Over Layer | $\delta X_3 = 4.32$<br>$E_3 = 0.809$ | $\delta X_3 = 4.32 \pm 0.18$<br>$E_3 = 0.237 \pm 0.027$ |
| $x_3$ | Si Collection Layer | $\delta X_4 = 6.64 \pm 0.42$<br>$E_4 = 0.443 \pm 0.038$ | $E_4 = 0$ |
| $x_4$ | | | |

$\delta X$ in $\mu m$ and $E$ in MeV.

FIG. 13

METHOD FOR CHARACTERIZING THE UPSET RESPONSE OF CMOS CIRCUITS USING ALPHA-PARTICLE SENSITIVE TEST CIRCUITS

ORIGIN OF INVENTION

The invention described herein was made in the performance of work under a NASA Contract, and is subject to the provisions of Public Law 96-517 (35 USC 202) in which the Contractor has elected to retain title.

CROSS-REFERENCE TO RELATED APPLICATIONS

The present application is a continuation-in-part of U.S. patent application Ser. No. 07/672,705, filed on Mar. 19, 1991, now U.S. Pat. No. 5,331,164.

TECHNICAL FIELD

The present invention relates to bench-level assessment of digital IC sensitivity to SEU upsets and more specifically to a method for predicting the SEU susceptibility of a standard-cell D-latch using an alpha-particle sensitive SRAM, SPICE critical charge simulation results, and alpha-particle interaction physics.

BACKGROUND ART

The trend in electronic components has lead to the development of integrated circuits (ICs) that have higher operating frequencies and require less power per gate. This has been achieved in part by a reduction in the feature sizes that make up the transistors and wires that comprise the ICs. As a consequence, the amount of charge that is required to store a bit of information is about one-tenth of a pico-coulomb (pC), or about 600,000 electrons. Because the amount of charge is so small, cosmic rays can deposit enough charge in an IC to cause a single-event upset (SEU) and alter the state of the memory bit.

The importance of cosmic rays on the performance of integrated circuits in a space environment is evident in the upset rates of various satellites and spacecraft. For example, the Tracking and Data Relay satellite experiences a single event upset per day, which must be corrected from the ground. Such adverse experiences have caused a re-design of spacecraft, such as the Galileo spacecraft. The characterization of digital ICs to heavy ion induced upsets is essential for qualifying their use in critical systems to be used on spacecraft. This characterization usually requires evaluations at an ion source, such as a cyclotron. Such evaluations are time consuming, expensive and error prone. In recent years, laser pulses have been proposed as substitutes for the heavy ion sources. However, the laser simulations are limited by metal layers that frequently block the laser pulses from SEU-sensitive nodes and by the complexity of the ion-photon calibrations. The solution to the single event upset problem continues to be important, as the complexity of spacecraft grows, the size of integrated circuits decrease and as space systems are designed with circuits fabricated at non-radiation hardened foundries.

Thus it would be highly desireable to have a method for bench-level characterization of an IC such as a CMOS standard-cell D-latch, without requiring the use of large and expensive heavy ion sources.

SUMMARY OF THE INVENTION

The purpose of this invention is to provide a technique utilizing test structures to quickly and inexpensively characterize the SEU sensitivity of standard cell latches intended for use in a space environment. This bench-level approach utilizes alpha particles to induce upsets in a companion device, a low LET sensitive 4-k bit test SRAM. This SRAM consists of cells that employ an offset voltage to adjust their upset sensitivity and an enlarged sensitive drain junction to enhance the cell's upset rate.

The invention comprises a method for predicting the SEU susceptibility of a standard-cell D-latch using an alpha-particle sensitive SRAM, SPICE critical charge simulation results, and alpha-particle interaction physics. Measurements were made on a 1.6-$\mu$m n-well CMOS 4k-bit test SRAM irradiated with an Am-241 alpha-particle source. A collection depth of 6.09 $\mu$m was determined using these results and TRIM computer code. Using this collection depth and SPICE derived critical charge results on the latch design, an LET threshold of 34 Mev cm$^2$/mg was predicted. Heavy ion tests were then performed on the latch and an LET threshold of 41 MeV cm$^2$/mg was determined.

OBJECTS OF THE INVENTION

It is therefore a principal object of the present invention to provide a method for quickly and inexpensively characterizing the single-event upset (SEU) sensitivity of standard cell latches intended for use in a space environment.

It is another object of the invention to provide a method for predicting the SEU susceptability of a standard-cell D-latch using an alpha-particle sensitive SRAM, critical charge simulation results and alpha-particle interaction physics.

It is still another object of the invention to provide a bench-level technique for characterizing CMOS standard-cell D-latches using alpha-particle sensitive test circuits to obviate heavy ion sources which are expensive and time consuming to use.

BRIEF DESCRIPTION OF THE DRAWINGS

The aforementioned objects and advantages of the present invention, as well as additional objects and advantages thereof will be more fully understood hereinafter as a result of a detailed description of a preferred embodiment when taken in conjunction with the following drawings in which:

FIG. 13 is a schematic illustration of the paths of protons from a proton source to the SRAM;

DETAILED DESCRIPTION OF A PREFERRED EMBODIMENT

Test SRAM and D-Latch Designs

The test SRAM and latch designs disclosed herein were submitted to the MOS Implementation System (MOSIS) and fabricated at a 1.6-$\mu$m n-well double, metal CMOS/bulk foundry.

Figure 1:
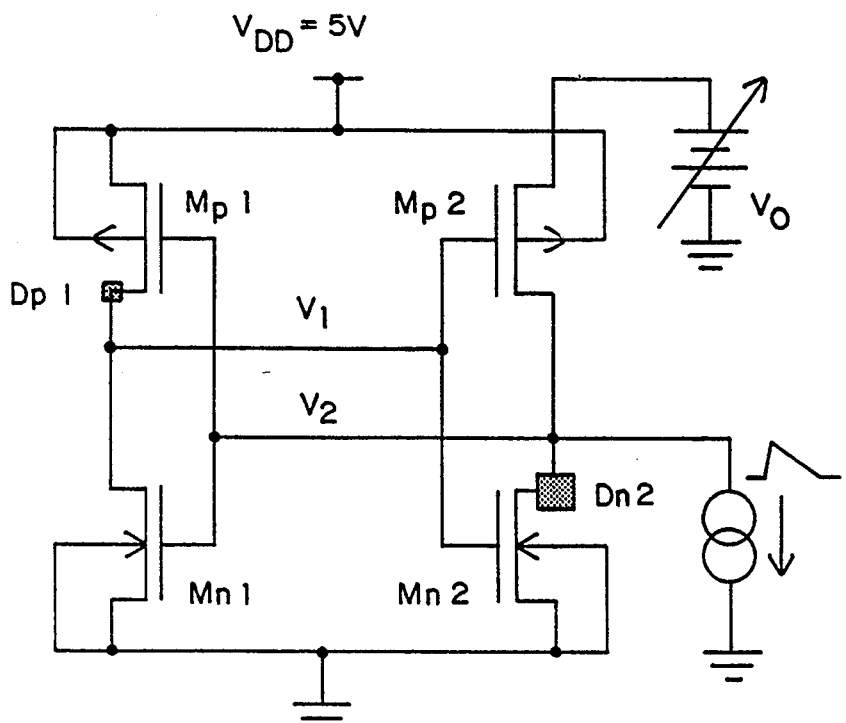
FIG. 1 is a schematic drawing of a test SRAM cell.

A schematic diagram of the test SRAM cell is shown in FIG. 1. This figure does not include the read/write transistors. The pulsed current source is used to model an alpha particle strike on drain Dn2 when calculating the critical charge of the cell with SPICE. This cell differs from that of a standard six-transistor SRAM cell in three ways: (1) the source of the p-MOSFET, Mp2, is connected to an adjustable offset voltage, $V_o$, instead of $V_{DD}$ to provide a control of the cells critical charge; (2) the drain area of n-MOSFET Mn2, Dn2, has been enlarged by a factor of four over minimum to enhance upset rates, thus reducing measurement time; and (3) the cell is imbalanced by widening Mn2 over minimum to enhance its SEU sensitivity versus $V_o$ response. The dimensions of the MOSFETs and their drains is given in Table 1. The bloated drain Dn2, is fabricated in a p-type substrate doped to $5 \times 10^{14}$ cm$^3$. The Dn2 junction has enhanced charge collection due to funneling compared to charge collected by the p-MOSFET drain formed in the n-well, which truncates the ion-induced plasma track.

TABLE 1

| DEVICE | L ($\mu$m) | W ($\mu$m) | AD ($\mu$m$^2$) |
|---|---|---|---|
| Mn1 | 1.6 | 2.4 | 17.92 |
| Mn2 | 1.6 | 3.2 | 74.88 |
| Mp1 | 3.2 | 2.4 | 12.16 |
| Mp2 | 3.2 | 2.4 | 12.16 |

In operation all the memory cells are written into a "sensitive" state where Mn2 is turned ON, connecting $V_o$ to the bloated drain, Dn2. $V_o$ is then lowered from $V_{DD}=5$ V for a period called the stare time. Thereafter $V_o$ is returned to $V_{DD}$ and the cells are read to determine the number of upset cells. This cycle is repeated at different values of $V_o$ and can be repeated a number of times at a given $V_o$ to improve the resolution of the measurement.

Figure 2:
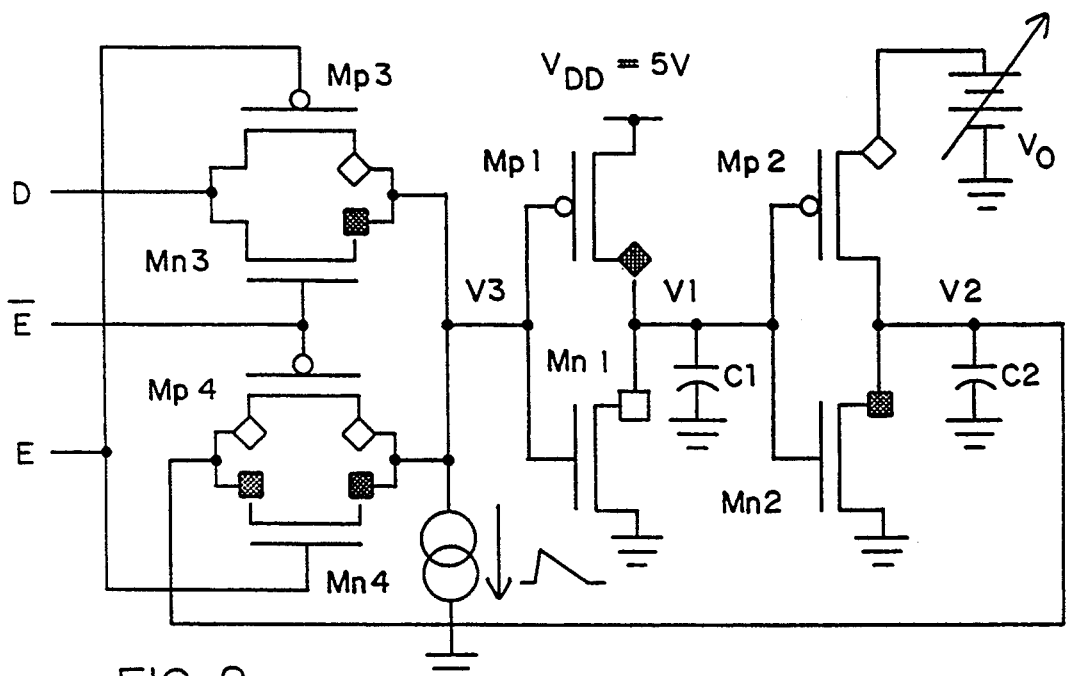
FIG. 2 is a schematic drawing of a D-latch in the zero state and illustrating reverse biased SEU-sensitive drain diodes.
Figure 3:
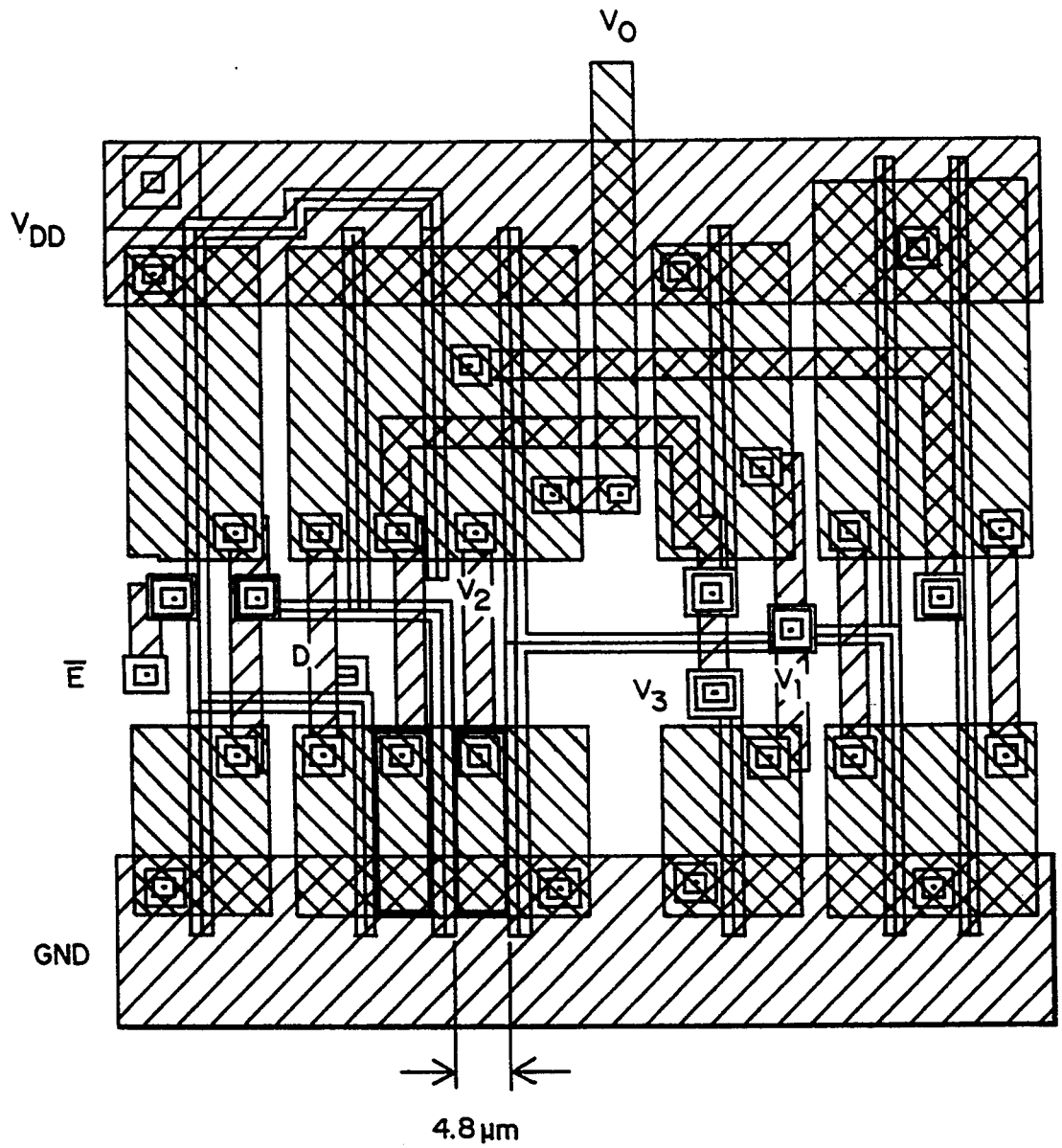
FIG. 3 is a layout drawing of a standard-cell latch.

The latch results presented herein were obtained from a 64-cell modified transparent D-latch array fabricated through the same foundry as the test SRAM. In FIG. 2 a schematic diagram of this latch is shown with the latch in the zero state where reverse biased SEU-sensitive drain diodes are represented by said squares. The offset voltage, $V_o$ was added to sensitize the latch to alpha particles. The source of Mp2 is tied to $V_{DD}$ in the unmodified latch. The diodes designated with solid squares collect the most charge when struck by an ionized particle because they sit in the p-substrate. The layout of the latch cell is shown in FIG. 3. This layout includes an inverter that generates enable-bar, and inverters that buffer the V1-node and the V2-node. The sensitive diode areas at the V2-node and V3-node that are designated with solid squares in FIG. 2, are outlined with a bold line in FIG. 3. These diodes each have an area of 69 $\mu$m$^2$.

Spice Analysis

Figure 4:
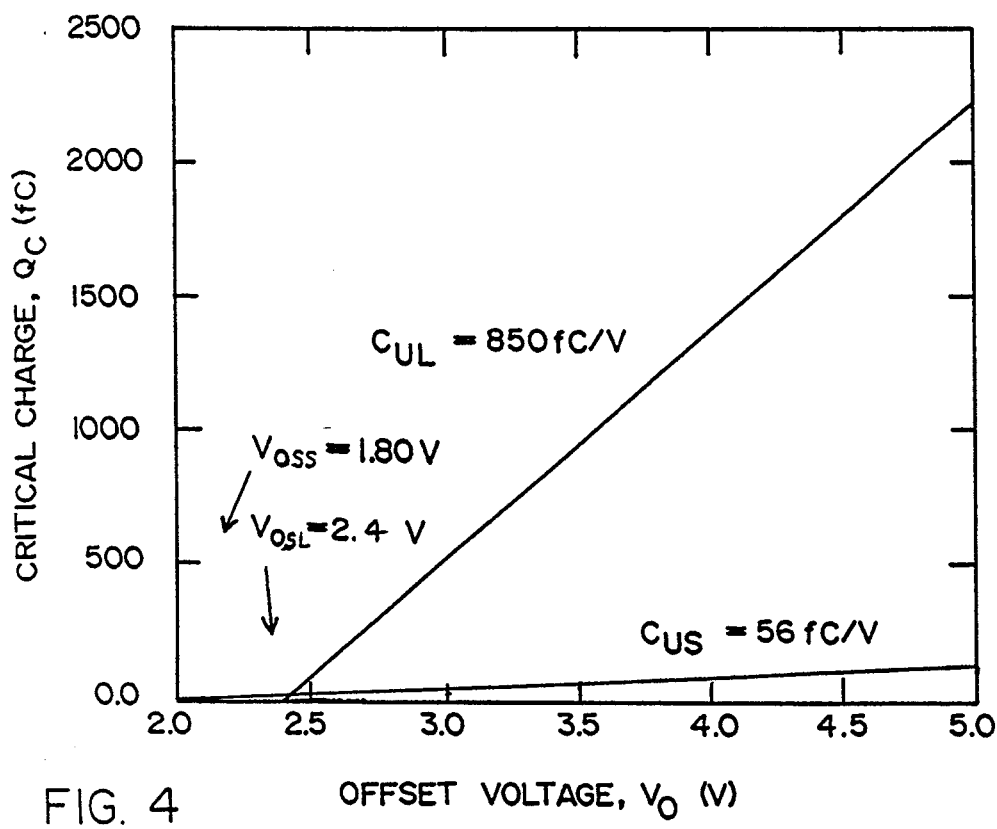
FIG. 4 is a graphical illustration of critical charge versus offset voltage for both an SRAM and a latch.

The critical charge, $Q_c$ of the test SRAM cell and the D-latch cell were determined as a function of $V_o$ using MOSIS supplied parameters and SPICE. The parasitic nodal capacitances were modeled by fixed metal and polysilicon interconnect capacitances and by the drain depletion capacitances given by their areas and peripheries and by the SPICE LEVEL 2 junction capacitance parameters. A triangle current pulse with a 1:19 rise:fall shape was used to upset these cells. For a given pulse height, the transient simulation was evaluated out to 100 ns where the response was compared to $V_{DD}/2$ to determine if the cell had flipped. The pulse height was adjusted using the binary search algorithm until the difference in charge (area under current pulse) between successive simulation runs differed by less than 1 fC. The resulting critical charge versus $V_o$ response for the V2-node of the test SRAM cell and for the average of the V2-node and V3-node for the D-latch is shown in FIG. 4. These results were found to be invariant with current pulse widths up to 500 ps. Since the alpha particle pulse width is about 200 ps, the response of these circuits exceeds that of the alpha particle pulse width.

As $V_o$ decreases the critical charge of the SRAM cell and D-latch decreases approximately linearly and goes to zero at $V_o=V_{os}$. For the SRAM cell $V_{osS}=1.8$ V and for the latch $V_{osL}=2.4$ V. DC SPICE simulations of these bistable circuits show that the sensitive state and metastable state approach each other as $V_o$ decreases until they are equal at $V_o=V_{os}$. For $V_o \leq V_{os}$ the circuit spontaneously goes to the flipped state. The circuit at this point is no longer bistable. $V_{os}$ is a function of the threshold voltages and geometries of the n- and p-MOSFETs. Process induced dispersion in the MOSFET parameters gives rise to a dispersion in $V_{os}$ for an array of cells. The slopes of the critical charge curves in FIG. 4 are defined by their upset capacitances, $C_U = \delta Q_c / \delta V_o$. The upset capacitance of the SRAM cell is $C_{US} = 56$ fC/V and of the latch cell is $C_{UL} = 850$ fC/V. SPICE is a well-known computer program for simulating and analyzing circuits which, for example, is described in detail in the text entitled "SPICE: A Guide To Circuit Simulation And Analysis Using PSPICE", second edition by Paul W. Twimenga, copyright 1992, Prentice Hall.

Test SRAM Alpha-Particle Response

Figure 5:
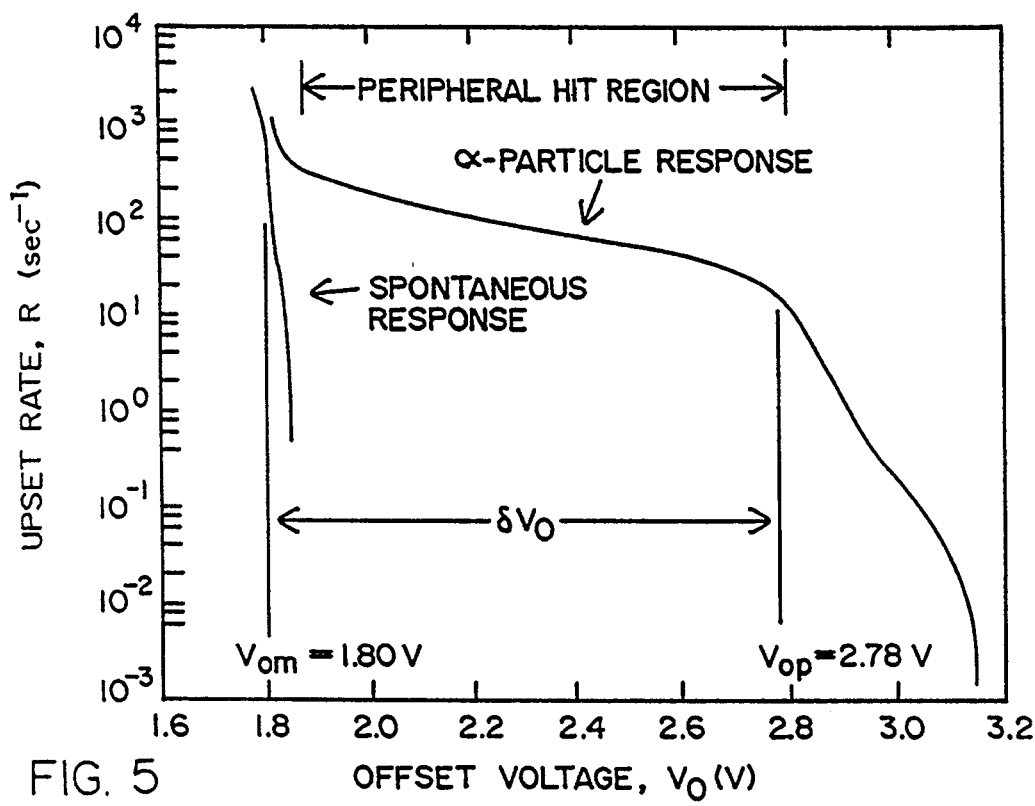
FIG. 5 is a graphical illustration of upset rate versus offset voltage for an SRAM in response to a 4.6 $\mu$Ci Am-241 source.

The response of the SRAM to alpha particles from a 4.6 $\mu$Ci Am-241 source placed 0.508 cm above the SRAM in air is shown in FIG. 5. Also shown, is the spontaneous response which was measured without the alpha-particle source present. As $V_o$ is lowered from $V_o$, the SRAM begins to upset at $V_o < 3.2$ V in a region termed the tail region. As $V_o$ is further lowered, the upset rate increases more slowly; this region is termed the periphery hit region. Finally, as $V_o$ reaches $V_{os} = 1.8$ V, the upset rate increases very rapidly in what is termed the spontaneous flip region.

In the periphery hit region, cells upset when the alpha particle hit the Dn2 drain or come close to, but miss, the Dn2 drain. This effect can be explained by a delayed field-funneling effect and to diffused charge that is collected by Dn2. Since the cell critical charge decreases as $V_o$ decreases, the alpha particles can strike further from the Dn2 depletion edge and still upset the cell.

The upset rate R, displayed in FIG. 5, was obtained by dividing the average measured number of upsets $N_a$ that occurred in a stare time t by t, or $R = N_a/t$, where $$N_a = \frac{1}{k} \sum_{i=1}^{k} N_i \pm \frac{1}{k} \left( \sum_{i=1}^{k} N_i \right)^{\frac{1}{2}} \quad (1)$$

and the number of samples, k=200. The stare time in this case was fixed at 2 seconds. The spontaneous upset data was also divided by t so that both responses saturate at $N_t/t = 2048$, where $N_t$ is the number of cells in the memory cell (4096 in this case). The response of the SRAM cells is given by the detector equation:

$$\frac{dN}{dt} = \sigma \Phi (N_t - N) \quad (2)$$

whose homogeneous solution with initial condition at t=0 of no tripped cells (N=0) is:

$$N = N_t(1 - \epsilon^{-\sigma \Phi}) \quad (3)$$

where $\sigma$ is the device cross section (Dn2 drain area), and $\Phi$ is the total integrated flux whose particles deposit charge exceeding the critical charge $Q_c$ required to trip a cell.

The upset capacitance $C_U$, the spontaneous upset voltage $V_{os}$, and the hole-electron pair charge-energy factor for silicon K=44.2 fC/MeV enable one to calibrate the offset voltage $V_o$ axis in terms of the critical energy $E_c$, by $$E_c = (C_U/K)(V_o - V_{os}), \quad (4)$$

or for this SRAM, $E_c = 1.267(V_o - 1.8)$ MeV.

Figure 6:
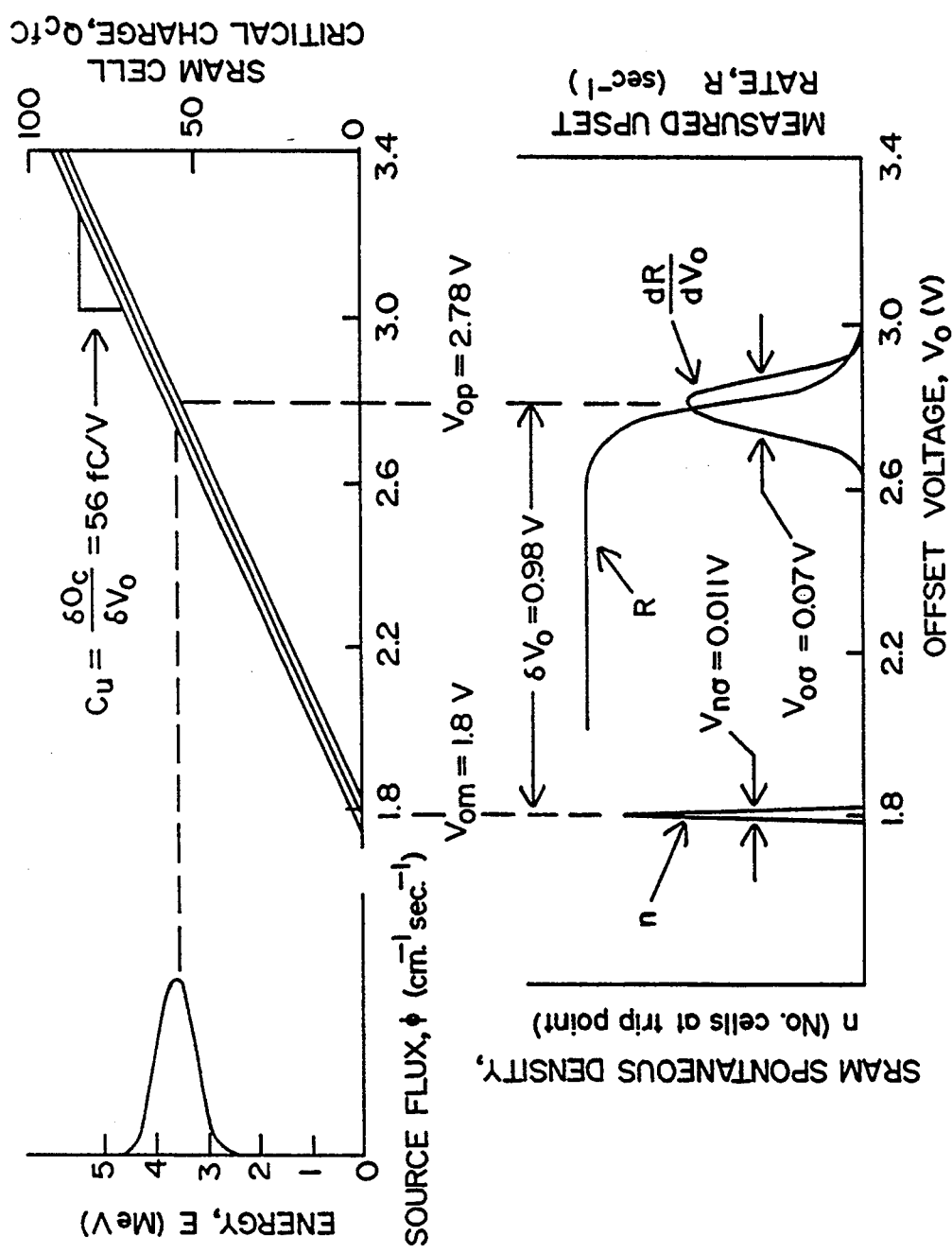
FIG. 6 is a graphical illustration of the relationship between measured upset rate, the spontaneous density function, the source spectra and the SRAM critical charge response.

FIG. 6 illustrates the relationship between upset rate R, the SRAM spontaneous density n, the source spectra $\Phi$, and the SPICE derived critical charge curve. The spontaneous density, $n = dR/dV_o$, is the derivative of the spontaneous response data shown in FIG. 5, and was found to be Gaussian with a mean and standard deviation of $V_{os} = 1.8 \pm 0.011$ V. The area under the $n(V_o)$ curve is equal to $N_t$. The exponential periphery hit response is not shown in FIG. 6 because it was subtracted from the measured R. In the analysis to follow, the spontaneous density, n, is approximated as an impulse function. This is justified for the SRAM data shown in FIG. 5 because the slope of n/t=4096 cells/34 mV sec is much steeper than the SRAM alpha-particle response.

Figure 7:
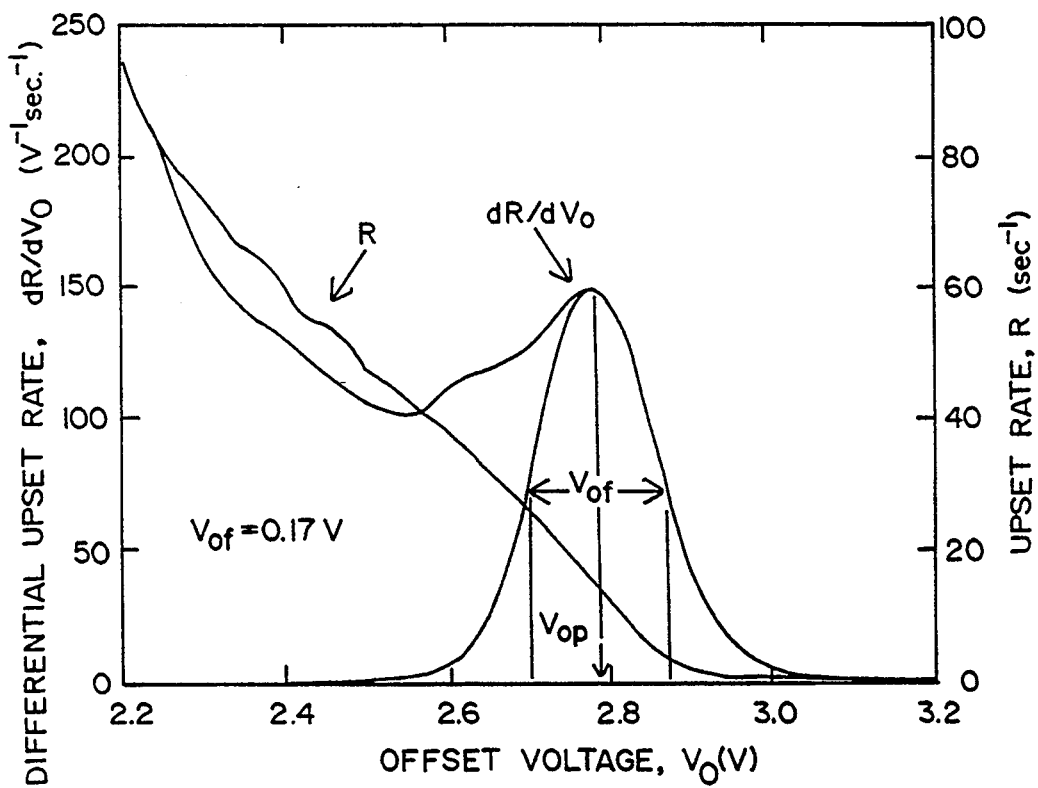
FIG. 7 is a graphical illustration of a test SRAM differential upset rate response versus offset voltage.

The tail region response shown in FIG. 5 was smoothed and differentiated using a twenty-five point least squares difference algorithm. This differential response, shown in FIG. 7, is composed of a number of peaks plus the onset of the peripheral hit response. These peaks are due to the selective degradation of the alpha-particle energies as the particles pass through the various regions found in the bloated drain Dn2. The major peak, shown in FIG. 7, is due to the alpha particles that pass through the thickest regions; those covered with metal 2 (M2). This M2 region is 38.2 $\mu m^2$. In the region covered with M2, the alpha particles lose more energy than in other regions so that they have the highest linear energy transfer (LET).

Figure 8:
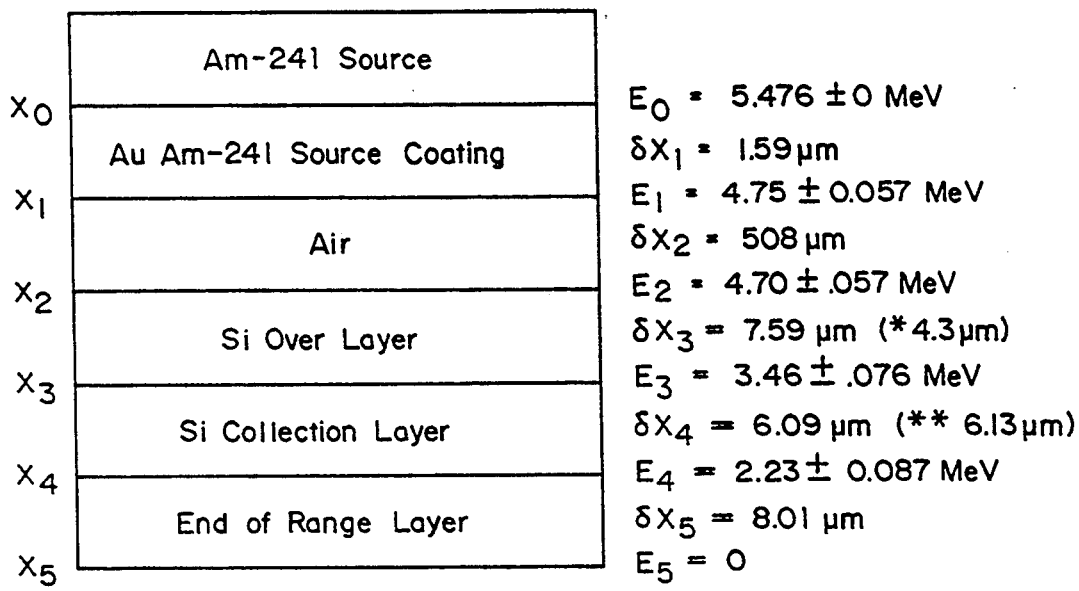
FIG. 8 is a schematic illustration of the path of alpha-particles from an alpha-particle source through the SRAM.

A schematic view of the path of the alpha particle through the silicon is shown in FIG. 8. The thickness $X_4 - X_2$ is obtained by first converting the full-width-half-maximum of the peak in the response curve shown in FIG. 7, $V_{of}$, to the voltage straggle, $V_{o\sigma}$, of the alpha particles at the end of the collection region in the silicon using $V_{o\sigma} = V_{of}/2.35$. Then the voltage straggle is converted to energy straggle using $$E_\sigma = (C_u/K)V_{o\sigma} \quad (5)$$

Finally, $X_4 - X_2 = 13.58$ $\mu$m was calculated using the range-straggle tables for alpha particles in silicon.

The silicon collection layer thickness $\delta X_4$ was determined from the offset voltage shift $\delta V_o = V_{op} - V_{os} = 0.98$ V. This was converted to an energy shift using $$\delta E = (C_u/K)V_o \quad (6)$$

$\delta X_4 = 6.09$ $\mu$m was calculated using the energy range tables for alpha particles in silicon. Finally the overlayer thickness, $\delta X_3$ was calculated by $\delta X_3 = (X_4 - X_2) - \delta X_4 = 7.59$ $\mu$m.

D-Latch Alpha Particle Response

The alpha-particle response of the latch array was obtained in the same manner as for the SRAM except that the Am-241 source was placed 0.558 cm above the latch chip in air. The results, shown in FIG. 9, include the spontaneous data obtained before and after exposing the part to alpha particles. The shift observed in these responses is due to total dose effects such as the charging of gate oxides. The average of the pre- and post-radiation spontaneous data was used in the analysis of this part.

Figure 9:
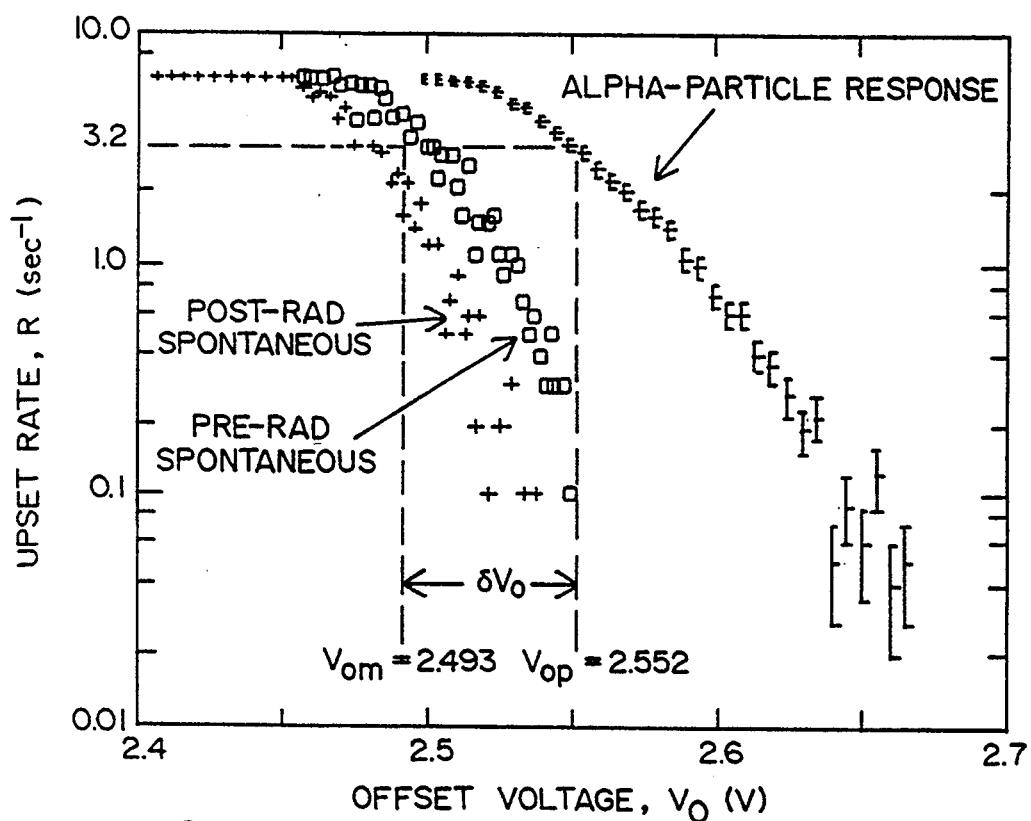
FIG. 9 is a graphical illustration of the D-latch alpha-particle response.
Figure 10:
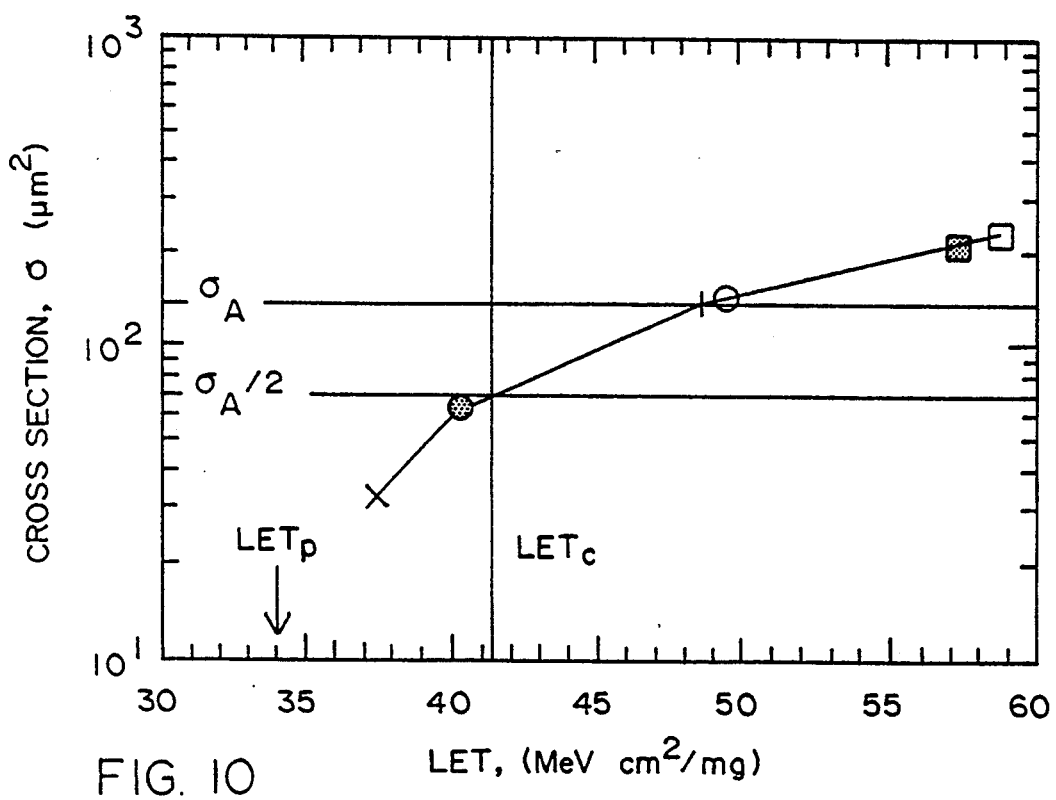
FIG. 10 is a graphical illustration of a heavy ion test performed on a latch for purposes of comparison with the inventive method herein.

The dispersion in the latch alpha-particle response, shown in FIG. 9, is primarily that of the spontaneous response because the offset voltage dispersion due to the alpha-particle energy spectrum is much smaller than the dispersion in the spontaneous response. This is a consequence of the reduced energy detection sensitivity of the latch ($K/C_{UL} = 0.052$ V/MeV for the latch versus $K/C_{US} = 0.789$ V/MeV for the SRAM). The dispersion in the latch alpha-particle response, $V_{os} = 34$ mV, was found by fitting the data to a Gaussian function. As shown in FIG. 9 the shift in the offset voltage, $\delta V_o$, was obtained between the points on the average spontaneous curve and the alpha-particle curve where, on the average, half of the latch cells are flipping ($N_t/2 = 32$). Using the SPICE derived upset capacitance for the latch, $C_{UL} = 850$ fC/V, the collected charge required to upset a latch cell is $\delta Q_{cL} = 50.2 \pm 28.9$ fC which agrees with that obtained with the SRAM, $Q_{cS}$. The dispersion in $Q_{cL}$, however, is large compared to the dispersion in $Q_{cS}$. Since $Q_{cL}=Q_{cS}$, it is valid to apply the collection depth $dX_4$ and the over layer thickness obtained with the SRAM to the analysis of the latch.

For the latch, the LET threshold for $V_{DD}=5$ V operation can be predicted from the SPICE derived upset capacitance, $C_{UL}$, the measured mean spontaneous offset voltage, $V_{os}$, and the collection depth obtained from the SRAM alpha-particle response, $\delta X_4$:

$$LET = \frac{C_{UL}(V_{DD} \cdot V_{os})}{K\rho\delta X_4} = 34 \frac{MeV\,cm^2}{mg} \quad (7)$$

where, $C_{UL}=850$ fC/V, $V_{os}=2.49$ V, $K=44.2$ fC/MeV, $\rho=2320$ mg/cm$^3$ for Si, and $\delta X_4=6.09 \times 10^{-4}$ cm.

D-Latch Heavy Ion Response

Heavy ion tests were performed at the Brookhaven National Laboratory on the latch array with $V_{DD}=V_o=5$ V. These measurements were made by gating the ion beam on and then off when a fluence, $F=1.13 \times 10^7$ ions/cm$^2$ cos $\theta$ was reached, where $\theta$ is the angle of incidence. The stare time was set so that an average of two upsets would occur each test cycle. This assured that essentially all $N_t=64$ latch cells in the array were susceptible to upset and allowed the effective cross section per cell to be calculated by:

$$\sigma = \frac{N}{N_t F \cos\theta} \quad (8)$$

where N is the total number of upsets that occur while the ion beam is gated on.

Using the average over layer thickness, $\delta X_3=4.3$ μm, and the collection depth, $\delta X_4=6.1$ μm obtained from the SRAM alpha particle measurements, the energies of the ions used in the test were computed from the TRIM at the entry point of the Si collection layer, $X_3$, and at the exit point of the Si collection layer, $X_4$. The average LET of the ion in the collection layer was then calculated by: $LET=[E(X_3)-E(X_4)]\rho\delta X_4$. These results are shown in Table 2 and in FIG. 9.

TABLE 2

| ION | PLOT SYMBOL | ANGLE, $\theta$ (degrees) | $\sigma$ ($\mu m^2$) | LET (MeV/cm$^2$mg) |
|---|---|---|---|---|
| I-127 | □ | 0 | 232 | 58.8 |
| Br-79 | ■ | 45 | 209 | 57.3 |
| Br-79 | ○ | 35 | 144 | 49.5 |
| Br-79 | ● | 0 | 63.8 | 40.3 |
| Fe-56 | X | 45 | 33.0 | 37.5 |

A test SRAM, designed to be upset-sensitive (LET soft) and having an electrically adjustable critical charge has been characterized using alpha particles using an inexpensive laboratory setup. The SRAM alpha particle results and SPICE simulation results facilitated in predicting the LET threshold of a standard-cell D-latch. The predicted LET=34 MeV cm$^2$/mg compares favorably with heavy ion test value of 41 MeV cm$^2$/mg.

Preferred Analysis Method

A preferred method for calibration of the SRAM detector will now be described in conjunction with FIGS. 11 to 16. The procedure requires determining the detector's overlayer thickness, $\delta X_3$, and collection depth, $\delta X_4$. These were determined using 0.55 and 1.0 MeV protons from the Caltech Tandem Van de Graaff. The analysis requires knowledge of the proton charge deposition versus range and this was calculated using particle range physics from TRIM. The validity of the analysis was verified with energy straggling measurements. Finally, the SPICE circuit simulation program was used to compute the relationship between the charge deposited in the memory cell and the cell offset voltage.

The critical charge, $Q_c$, of the SRAM cell was determined as a function of $V_o$ using MOSIS supplied SPICE parameters. The parasitic nodal capacitances were modeled by fixed metal and polysilicon interconnect capacitances and by the drain depletion capacitances using their areas and peripheries. The SPICE simulation used the level-2-model. A triangle current pulse with a 1:19 rise:fall shape was used to upset these cells. The location of the pulse generator in the memory cell is shown in FIG. 1. For a given pulse height, the transient simulation was examined at 100 ns where the response was compared to $V_{DD}/2$ to determine if the cell had flipped. The current pulse height was adjusted using a binary search algorithm until the difference in charge (area under current pulse) between successive simulation runs differed by less than 1 fC. These results were found to be invariant with current pulse widths up to 500 ps. Since the proton width is about 200 ps, the response of these circuits exceeds that of the proton current pulse.

Figure 11:
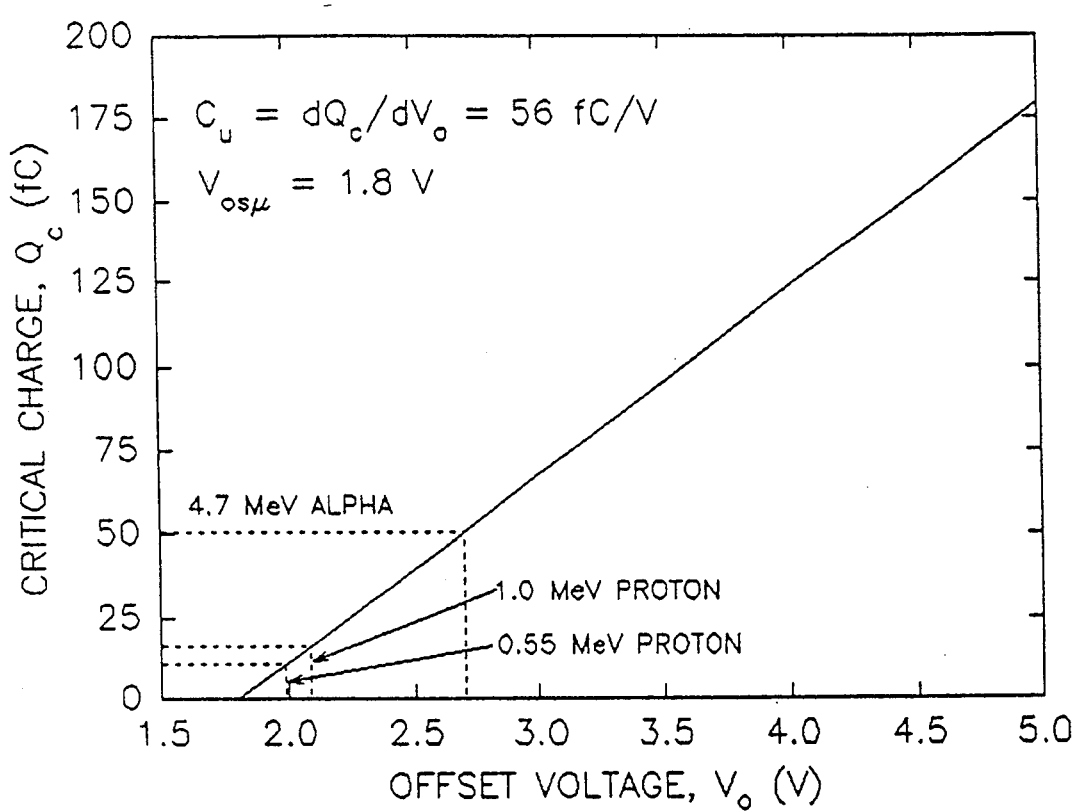
FIG. 11 is a graphical illustration of the SRAM critical charge response for Node V2 of FIG. 1 calculated using SPICE-2.

SPICE simulations provide the $Q_c$ versus $V_o$ curve shown in FIG. 11 which is well approximated by the straight line relationship:

$$Q_c = C_u(V_o - V_{os\mu})$$

where $V_{os\mu}=1.8$ V is the mean offset voltage in the spontaneous flip range and the slope is the upset capacitance, $C_u=dQ_c/dV_o=56$ fC/V.

In the SRAM test sequence, all memory cells are written into the sensitive or stare state where Mn2 is turned OFF and Mp2 is turned ON which connects $V_o$ to the bloated drain, Dn2; see FIG. 1. $V_o$ is then lowered from 5 V for a period called the stare time which can last a few seconds to several days. Thereafter, $V_o$ is returned to 5 V and the cells read to determine the number of upsets. This cycle is repeated for different values of $V_o$.

Figure 12:
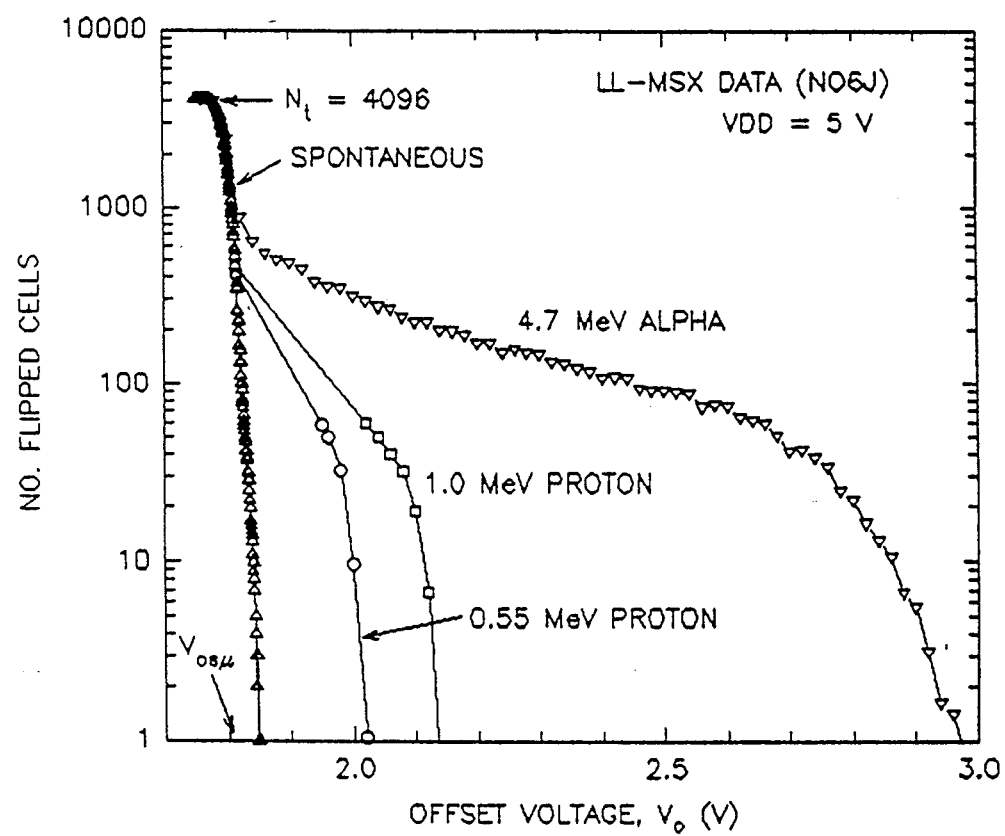
FIG. 12 is a graphical illustration of the number of flipped cells for alpha particles and protons shown relative to the spontaneous bit flip response for a store time of one second.

Test results are shown in FIG. 12 for protons and alpha particles and compared against the spontaneous flip response. The overall behavior indicates that at high $V_o$ the response curve is determined by particle energy straggling. At intermediate $V_o$, the response is determined by the collection of particles outside the area of drain Dn2. This is called the peripheral hit region of the curve. Finally, at low $V_o$, the cells flip spontaneously.

Layer Thickness Analysis

The following analysis is used to determine the SRAM detector Dn2 overlayer material thickness, $\delta X_3$, and charge collection region thickness, $\delta X_4$. A schematic view of these layers is shown in FIG. 13.

The analysis requires the determination of offset voltage, $V_{op}$, at the peak of the particle upset distribution. In this technique the particle upset distribution is Gaussianly distributed as seen in the cumulative probability plot shown in FIG. 14. The analysis follows from the SRAM detector equation:

$$dN/dt = \sigma\phi(N_t - N)$$

where $\sigma$ is the area of Dn2, $\phi$ is the flux, N is the measured number of flipped cells, and $N_t$ is the total number of cells in the SRAM. Evaluating for $N \to 0$ $$dN/dt \; N\to 0 = R_o = \sigma\phi N_t$$

The particle flux at diode, Dn2, is described by the Gaussian or normal distribution expressed by the error function:

$$\phi = \phi_m\{1 - \text{erf}[(V_{op} - V_{op}\,\mu)/V_{op}\,\sigma\sqrt{2}]\}/2$$

where $\phi_m$ is the maximum particle flux entering the SRAM, $V_{op}$ is the offset voltage in the vacinity of the upset peak, $V_{op\mu}$ is the mean or peak value, and $V_{op\sigma}$ is the standard deviation for the upset distribution. Note that $\phi = \phi_m/2$ at $V_{op} = V_{op\mu}$ which states that only half the particle flux entering the SRAM can upset cells.

Combining the above equations leads to the following expression for the number of flipped cells in the vacinity of the particle upset distribution:

$$N = R_o/\sigma\phi_m = N_t\{1 - \text{erf}[(V_{op} - V_{op}\,\mu)/V_{op}\,\sigma\sqrt{2}]\}/2$$

Figure 14:
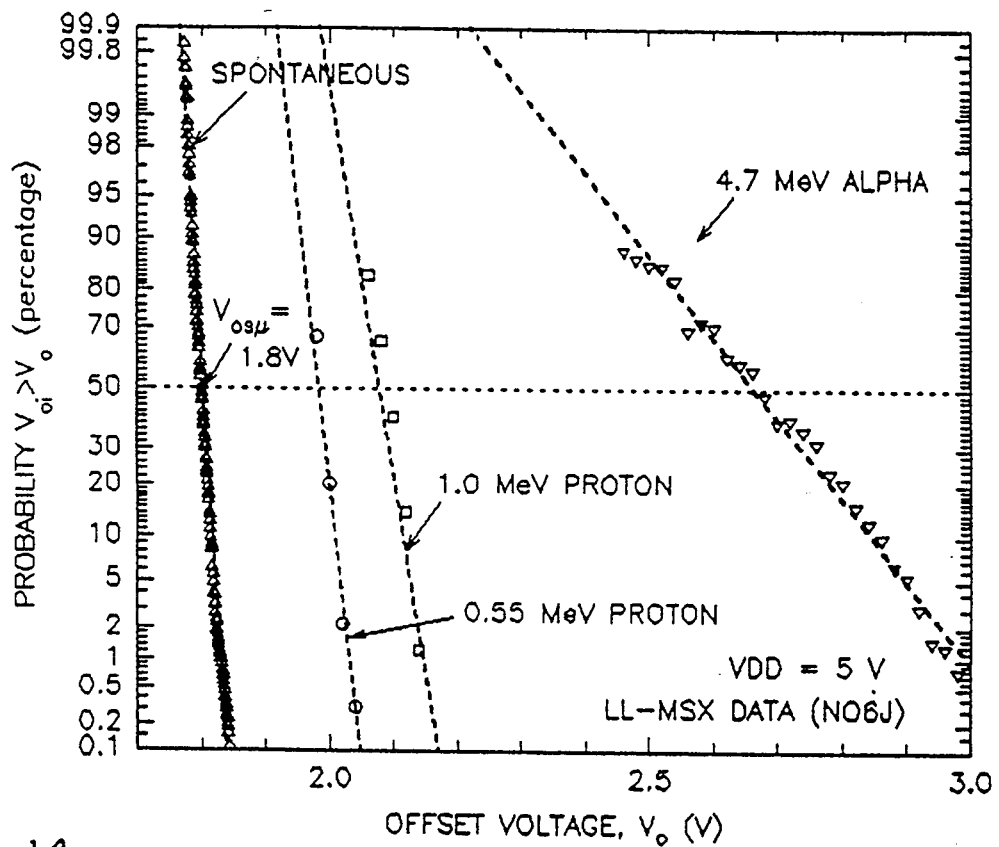
FIG. 14 is a graphical illustration of the SRAM upset probability distribution for alpha particles and protons shown relative to the spontaneous bit flip response.

The probability distribution given in percent and plotted in FIG. 14 was determined from:

$$P(V_{oi} > V_{op}) = 100 \cdot (N - 0.5)/N_t$$

where N is the number of flipped cells at $V_{op}$ and for this SRAM $N_t = 4096$ cells.

The calculation of N can take two approaches. The first approach is used when the experimenter knows the beam flux, $Q_m$. In this case, $N = R_o/\sigma\phi_m$ where $\sigma = 68.8$ $\mu$m for Dn2. The second approach is used when the experimenter knows the beam fluence, $F_m$, and the number of upsets, $N_f$, observed during the time the beam is on. That is $N = N_f/\sigma F_m$. This approach is useful when the flux is variable and the fluence can be monitored.

The data points in FIG. 14 allow an analysis of the Gaussian nature of the energy dispersion of the particles as they lose energy in the silicon. At the peak of the upset distribution, at the 50 percent point, only half of the particles can deposit sufficient charge to flip the cells. This is defined as $Q_{cp}$ and is given by:

$$Q_{cp} = C_u(V_{op\mu} - V_{os\mu})$$

where $Q_{cp}$ values for the four curves shown in FIG. 14 are listed in Table 3.

Figure 15:
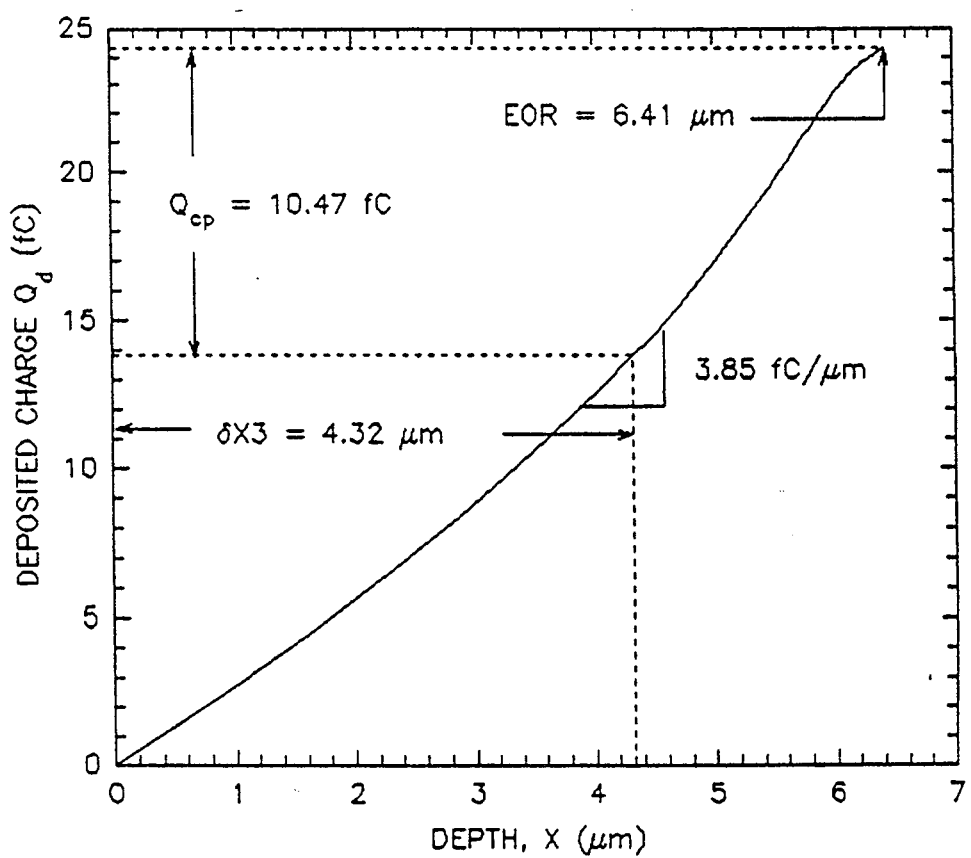
FIG. 15 is a graphical illustration of charge deposited by 0.55 MeV protons in silicon which is used to calculated the over-layer thickness, $\delta X_3$.

The SRAM overlayer thickness, $\delta X_3$, was determined using a 0.55 MeV proton beam which stopped within the collection layer. This is crucial for it means that all the charge deposited in the collection layer, $\delta X_4$, is collected by the diode Dn2. The charge deposited by the 0.55 MeV proton beam is shown in FIG. 15. This curve was plotted using TRIM. The analysis for $\delta X_4$ begins by determining $V_{op\mu}$ for the 0.55 MeV proton upset data shown in FIG. 14; the results are listed in Table 3. Then $Q_{cp}$ is determined from FIG. 11. Finally, the $Q_{cp}$ value is subtracted from the End of Range, EOR, of the charge deposition curve shown in FIG. 15. Thus $\delta X_3 = 4.32$ $\mu$m.

Figure 16:
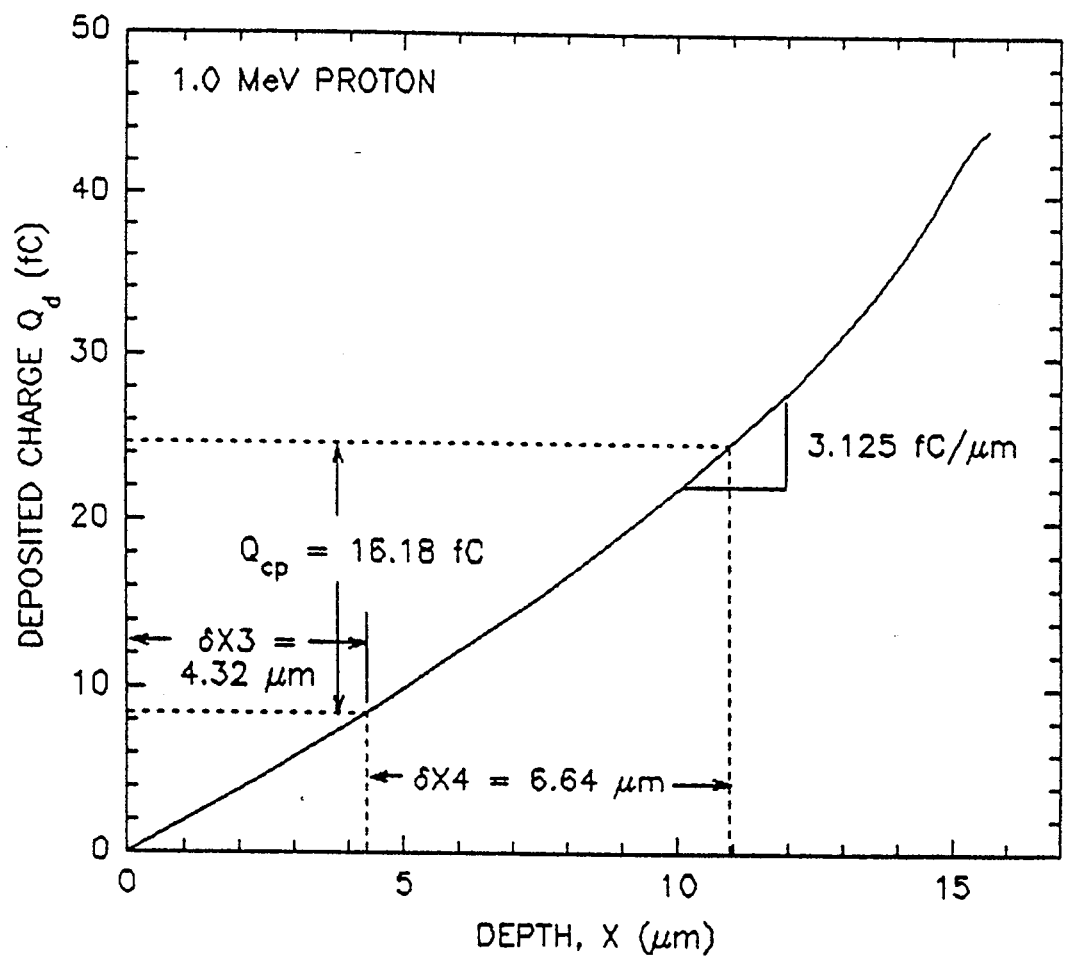
FIG. 16 is a graphical illustration of charge deposited by 1.0 MeV protons in silicon which is used to calculated the collection depth, $\delta X_4$.

The charge collection thickness, $\delta X_4$, was measured with 1.0 MeV proton beam which had a range greater than $\delta X_3 + \delta X_4$. The charge deposited by the 1.0 MeV proton beam is shown in FIG. 16. The analysis begins by determining $V_{op\mu}$ for the 1.0 MeV proton upset data shown in FIG. 14. Then $Q_{cp}$ was determined from FIG. 11. Finally $\delta X_4$ was determined by adding $Q_{cp}$ to the overlayer charge as determined from $\delta X_3$; the technique is illustrated in FIG. 16. Thus $\delta X_4 = 6.64$ $\mu$m.

The charge collection depth, $\delta X_4$, was also determined for a 4.7 MeV alpha particle and a collection depth of 6.33 $\mu$m was determined. This value is slightly smaller than the collection layer thickness determined for the 1.0 MeV proton. This is due to the fact that heavy particles have a shorter range.

The linear energy transfer, LET, in MeV·cm²/mg for the particles can now be calculated using:

$$LET = C_u(V_{op\mu} - V_{os\mu})/K_\rho \delta X_4$$

where for silicon $K = 44.2$ fC/MeV, $\rho = 2320$ mg/cm³, $C_u$ is in fC/V, $V_o$ is in Volts, and $\delta X_4$ is in cm. LET values are listed in Table 3. The LET value for $V_{op\mu} = 5$ V is 2.88 MeV cm²/mg for an estimated $\delta X_4 = 6.00$ $\mu$m. The conversion factor K is determined from:

$$K = 1.6 \times 10^{-19} \text{ (Coul./electron)} \times 10^{15}$$
$$(f\text{Coul./Coul.}) \times 10^6 \, (eV/MeV)/3.62(eV/eh-\text{pair}).$$

Layer Thickness Dispersion Analysis

The result of calculating the errors in $\delta X_3$ and $\delta X_4$, that is, $\delta X_\sigma$ and $\delta X_\sigma$, is shown in Table 3. It shows that as the 0.55 and 1.0 MeV protons pass through the various regions that the energy dispersion increases. This leads to an uncertainty in the thickness of each layer. The thickness dispersion is calculated from the energy dispersion. For the over-layer the depth dispersion is:

$$\delta X_{3\sigma} = \delta E_3 X_\sigma \cdot K \cdot d\delta X_3/dQ_d$$

where $\delta E_3 X_\sigma$ is the energy dispersion due to over-layer thickness variations and from FIG. 15, $dQ_d/d\delta X_3 = 3.85$ fC/$\mu$m. The collection layer depth dispersion is:

$$\delta X_{4\sigma} = \delta E_4 X_\sigma \cdot K \cdot d\delta X_4/dQ_d$$

where $\delta E_4 X_\sigma$ is the energy dispersion due to collection depth variations and from FIG. 16, $dQ_d/d\delta X_4 = 3.125$ fC/$\mu$m.

The evaluation of $\delta X_{3\sigma}$ requires an evaluation of $\delta E_{3\sigma}$. Since the 0.55 MeV protons stop in the charge collection region, the energy dispersion is determined by the Au scattering foil and the Si over-layer and not the Si collection layer. The energy dispersion for the 0.55 MeV protons is evaluated at the peak of the probability distribution as defined at the 50 percent point in FIG. 14, it is calculated from $E_{op\sigma}(0.55) = (C_u/K)V_{op\sigma}(0.55)$. This energy dispersion consists of the following components:

$$E_{op\sigma}(0.55) = [(E_{os\sigma})^2 + (E_{l\sigma})^2 + (\delta E_{3\sigma})^2]^{\frac{1}{2}}$$

where $E_{os\sigma} = (C_u/K)V_{os\sigma}$ is the instrument function energy dispersion, $E_{l\sigma}$ is the source Au scattering foil energy dispersion, and $\delta E_{3\sigma}$ is $$\delta E_{3\sigma} = [(\delta_{E_3}S_\sigma)^2 + (\delta_{E_3}X_\sigma)^2]^{\frac{1}{2}}$$

where $\delta E_3 S_\sigma$ is over-layer energy dispersion due to particle straggling and $\delta E_3 X_\sigma$ is the over-layer energy dispersion due to over-layer thickness fluctuations. The $E_{I\sigma} = 0.012$ MeV was determined from Rutherford scattering theory for a 1.2-$\mu$m thick Au foil. $\delta E_3 S_\sigma = 0.009$ MeV was determined from Rutherford scattering theory for a 4.32-$\mu$m thick over layer. $\delta E_3 X_\sigma$ is now calculated from the above two equations and $\delta X_{3\sigma} = 0.19$ $\mu$m was then determined.

The evaluation of $\delta X_{4\sigma}$ requires an evaluation of $\delta E_{4\sigma}$. Since the 1.0 MeV protons pass through the charge collection region, the energy dispersion is determined by the Au scattering foil, over-layer and collection layer. The energy dispersion for the 1.0 MeV protons is evaluated at the peak of the probability distribution as defined at the 50 percent point in FIG. 14; it is calculated from $E_{op\sigma}$ (1.0) = $(C_u/K)$ $V_{op\sigma}$ (1.0). This dispersion consists of the following components:

$$E_{op\sigma}(1.0) = [(E_{os\sigma})^2 + (E_{I\sigma})^2 + (\delta E_{3\sigma})^2 + (\delta E_{4\sigma})^2]^{\frac{1}{2}}$$

where $\delta E_{4\sigma}$ is $$\delta E_{4\sigma} = [(\delta E_4 S_\sigma)^2 + (\delta E_4 X_\sigma)^2]^{\frac{1}{2}}$$

where $\delta E_4 S_\sigma$ is collection layer energy dispersion due to particle straggling and $\delta E_4 X_\sigma$ is the energy dispersion due to collection layer thickness fluctuations. The $\delta E_4 S_\sigma = 0.011$ MeV was determined from Rutherford scattering theory for a 6.64-$\mu$m thick collection layer. $\delta E_4 X_\sigma = 0.025$ MeV is now calculated from the above two equations and $\delta X_{4\sigma} = 0.36$ $\mu$m was then determined.

TABLE 3

$\delta X_3$, $\delta X_4$, and LET Values

| PARTICLE | $Q_{cp}$ fC | $V_{op\mu}$ V | $V_{op\sigma}$ V | $\delta X_3$ $\mu$m | $\delta X_4$ $\mu$m | LET MeV · cm$^2$/mg |
|---|---|---|---|---|---|---|
| 0.55 MeV PROTON | 10.47 | 1.987 | 0.021 | 4.32 | — | — |
| 1.00 MeV PROTON | 16.18 | 2.089 | 0.030 | 4.32 | 6.64 | 0.24 |
| 4.70 MeV ALPHA | 50.40 | 2.66 | 0.143 | 4.32 | 6.33 | 0.77 |
| — SPONTANEOUS | 178.00 | 5.00 $V_{os\mu}$ 1.80 | — $V_{os\sigma}$ 0.012 | 4.32 | 6.00 | 2.88 |

Having thus described an exemplary embodiment of the invention, what is claimed:

1. A method of predicting the SEU susceptibility of a SRAM; the method comprising the steps of:
   a) providing an enhanced SEU sensitivity test SRAM having an electrically adjustable critical charge;
   b) determining the critical charge as a function of offset voltage to ascertain the upset capacitance $C_{US}$ of said test SRAM;
   c) exposing the test SRAM to a first known level of alpha particle energy to ascertain the overlayer thickness of said SRAM, said first known level being selected to stop the alpha particle energy in the collection layer of said SRAM;
   d) calculating the overlayer thickness $\delta X_3$ of said test SRAM based upon the charge deposited by said first known level;
   e) exposing the test SRAM to a second known level of alpha particle energy to ascertain the charge collection thickness of said SRAM, said second known level being selected so alpha particle energy stops beyond the collection layer;
   f) calculating the collection layer thickness $\delta X_4$ of said test SRAM based upon charge deposited by said second known level and the calculated thickness of said overlayer; and
   g) calculating the linear energy transfer (LET) for said test SRAM:

$$LET = \frac{C_{US}(V_{op\,\mu} - V_{os\,\mu})}{K\rho\delta X_4}$$

where $V_{op\mu}$ = the peak value of offset voltage at maximum particle upset distribution;

$V_{os\mu}$ = the mean offset voltage in the spontaneous flip range;

K = the hole-electron pair charge-energy factor for silicon;

$\rho$ = the density of silicon;

$C_{US}$ = upset capacitance for SRAM.

2. The method recited in claim 1 wherein in step a) said SRAM is made more sensitive to incident-ion-induced SEU by providing at least one pull-down field effect transistor having a bloated drain surface area and at least one pull-up field effect transistor having a source connected to an offset voltage.

3. The method recited in claim 1 wherein said offset voltage is determined by measuring the offset voltage at which about one-half of the total number of latch cells are upset spontaneously without deliberate ion exposure.

* * * * *